(12) United States Patent
Mouli

(10) Patent No.: US 7,141,841 B2
(45) Date of Patent: Nov. 28, 2006

(54) IMAGE SENSOR HAVING A TRANSISTOR FOR ALLOWING INCREASED DYNAMIC RANGE

(75) Inventor: Chandra Mouli, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/612,194

(22) Filed: Jul. 3, 2003

(65) Prior Publication Data

US 2005/0001246 A1    Jan. 6, 2005

(51) Int. Cl.
*H01L 31/062*    (2006.01)

(52) U.S. Cl. .............. 257/291; 257/233; 257/234; 257/290; 257/292; 257/461; 257/462

(58) Field of Classification Search .............. 257/118, 257/222, 229, 233, 234, 257, 258, 290, 291, 257/292, 461, 462
See application file for complete search history.

(56) References Cited

U.S. PATENT DOCUMENTS

| | | | | |
|---|---|---|---|---|
| 4,494,016 | A * | 1/1985 | Ransom et al. ............... 326/83 |
| 5,546,438 | A * | 8/1996 | Hynecek ...................... 377/60 |
| 5,912,836 | A * | 6/1999 | Liu et al. ............... 365/185.01 |
| 6,232,642 | B1 | 5/2001 | Yamazaki | |
| 6,498,331 | B1 * | 12/2002 | Kozlowski et al. ...... 250/208.1 |
| 6,504,195 | B1 * | 1/2003 | Guidash ...................... 257/292 |
| 2001/0020909 | A1 * | 9/2001 | Sakuragi et al. ............. 341/139 |
| 2002/0021121 | A1 | 2/2002 | Nakamura | |
| 2002/0054389 | A1 | 5/2002 | Takada et al. | |
| 2003/0137594 | A1 * | 7/2003 | Koizumi et al. ............. 348/308 |
| 2004/0043529 | A1 * | 3/2004 | Fossum ........................ 438/70 |

OTHER PUBLICATIONS

Peters, Laura—"Choices and Challenges for Shallow Trench Isolation," ASML, Semiconductor International, Apr. 1, 1999, 5 pages.
S. G. Chamberlain et al.—"A Novel Wide Dynamic Range Silicon Photodetector and Linear Imaging Array," IEEE Journal of Solid-State Circuits, vol. SC-19, No. 1, Feb. 1984.
A. J. Blanksby—"Performance Analysis of a Color CMOS Photogate Image Sensor," IEEE Transactions on Electron Device, vol. 47, No. 1, Jan. 2000.

* cited by examiner

*Primary Examiner*—Nathan J. Flynn
*Assistant Examiner*—Tan Tran
(74) *Attorney, Agent, or Firm*—Dickstein Shapiro LLP

(57) ABSTRACT

Embodiments of the invention provide an image sensor having an improved dynamic range. A pixel cell comprises at least one transistor structure. The transistor structure comprises at least one semiconductor channel region, at least one gate for controlling the channel region, and first and second leads respectively coupled to a source region on one side of the at least one channel region and a drain region on an opposite side of the at least one channel region. The transistor structure has at least two threshold voltages associated with the at least one channel region, and an I-V characteristic of the transistor structure is determined at least in part by the threshold voltages.

41 Claims, 10 Drawing Sheets

IMAGE SENSOR HAVING A TRANSISTOR FOR ALLOWING INCREASED DYNAMIC RANGE

FIELD OF THE INVENTION

The present invention relates to the field of semiconductor devices, particularly to an image sensor having an improved dynamic range.

BACKGROUND OF THE INVENTION

CMOS image sensors are increasingly being used as a lower cost alternative to CCDs. A CMOS image sensor circuit includes a focal plane array of pixel cells, each one of the cells includes a photogate, photoconductor, or photodiode having an associated a charge accumulation region within a substrate for accumulating photo-generated charge. Each pixel cell may include a transistor for transferring charge from the charge accumulation region to a sensing node, and a transistor, for resetting a sensing node to a predetermined charge level prior to charge transfer. The pixel cell may also include a source follower transistor for receiving and amplifying charge from the sensing node and an access transistor for controlling the readout of the cell contents from the source follower transistor.

In a CMOS image sensor, the active elements of a pixel cell perform the necessary functions of: (1) photon to charge conversion; (2) accumulation of image charge; (3) transfer of charge to the sensing node accompanied by charge amplification; (4) resetting the sensing node to a known state before the transfer of charge to it; (5) selection of a pixel for readout; and (6) output and amplification of a signal representing pixel charge from the sensing node.

CMOS image sensors of the type discussed above are generally known as discussed, for example, in Nixon et al., "256×256 CMOS Active Pixel Sensor Camera-on-a-Chip," IEEE Journal of Solid-State Circuits, Vol. 31(12), pp. 2046–2050 (1996); and Mendis et al., "CMOS Active Pixel Image Sensors," IEEE Transactions on Electron Devices, Vol. 41(3), pp. 452–453 (1994). See also U.S. Pat. Nos. 6,177,333 and 6,204,524, which describe operation of conventional CMOS image sensors, the contents of which are incorporated herein by reference.

A conventional CMOS pixel cell 10 is illustrated in FIGS. 1 and 2. FIG. 1 is a schematic top view of a portion of a semiconductor wafer fragment containing the exemplary pixel cell 10 and FIG. 2 is a circuit diagram of the pixel cell 10. The CMOS pixel cell 10 is a four transistor (4T) cell. Pixel cell 10 comprises a photo-conversion device, typically a photodiode 21, for collecting charges generated by light incident on the pixel. A transfer gate 7 transfers photoelectric charges from the photodiode 21 to a sensing node, typically a floating diffusion region 3. Floating diffusion region 3 is electrically connected to the gate of an output source follower transistor 27. The pixel cell 10 also includes a reset transistor having a gate 17 for resetting the floating diffusion region 3 to a predetermined voltage before sensing a signal; a source follower transistor 27 which receives at its gate an electrical signal from the floating diffusion region 3; and a row select transistor 37 for outputting a signal from the source follower transistor 27 to an output column line in response to an address signal.

Impurity doped source/drain regions 32 (FIG. 1), having n-type conductivity, are provided on either side of the transistor gates 17, 27, 37. Conventional processing methods are used to form, for example, contacts 33 (FIG. 1) in an insulating layer to provide an electrical connection to the source/drain regions 32, the floating diffusion region 3, and other wiring to connect to gates and form other connections in the pixel cell 10.

In the pixel cell 10 depicted in FIG. 1, electrons are generated by light incident externally and stored in the photodiode 21. These charges are transferred to the floating diffusion region 3 by the gate 7 of the transfer transistor. The source follower transistor 27 produces an output signal from the transferred charges.

Image sensors, such as an image sensor employing the conventional pixel cell 10, have a characteristic dynamic range. Dynamic range refers to the range of incident light that can be accommodated by an image sensor in a single frame of pixel data. It is desirable to have an image sensor with a high dynamic range to image scenes that generate high dynamic range incident signals, such as indoor rooms with windows to the outside, outdoor scenes with mixed shadows and bright sunshine, night-time scenes combining artificial lighting and shadows, and many others.

The dynamic range for an image sensor is commonly defined as the ratio of its largest non-saturating signal to the standard deviation of the noise under dark conditions. The dynamic range is limited on an upper end by the charge saturation level of the sensor, and on a lower end by noise imposed limitations and/or quantization limits of the analog to digital converter used to produce the digital image. When the dynamic range of an image sensor is too small to accommodate the variations in light intensities of the imaged scene, image distortion occurs.

Dynamic range in a charge coupled device (CCD) ($DR_{CCD}$) can be expressed as:

$$DR_{CCD} = 20\log\left[\frac{N_{sat}}{\sqrt{\left(\frac{\sigma_{output}}{G_0}\right)^2 + N_{dark}^2}}\right]$$

where $N_{sat}$ is the electron capacity of the CCD, $\sigma_{out}$ is the RMS read noise voltage of the sensor output stage, $G_0$ is the conversion gain, and $N_{dark}$ is the dark current shot noise expressed in RMS electrons. Therefore, maximizing the conversion gain can increase the dynamic range of the CCD until the output stage saturates. See Blanksby et al., "Performance Analysis of a Color CMOS Photogate Image Sensor," IEEE Transactions on Electron Devices, Vol. 47(1), pp. 55–64 (2000), which is incorporated herein by reference.

In a CMOS photodiode architecture, such as the pixel cell 10 shown in FIGS. 1 and 2, however, the saturation level is determined by read-out circuit considerations. The threshold voltage drops across the reset and source follower transistors 17 and 27 limit the available swing at the floating diffusion node 3. In this case the dynamic range can be expressed as:

$$DR_{CMOS-APS} = 20\log\left[\frac{V_{dd} - V_{t(reset)} - V_{t(source-follower)}}{\sqrt{\left(\frac{\sigma_{output}}{A_{SF}}\right)^2 + (G_{FD}N_{dark})^2 + (G_{FD}N_{reset})^2}}\right]$$

where $V_{t(reset)}$ and $V_{t(source-follower)}$ are the threshold voltages of the reset and source follower devices, respectively, $A_{SF}$ is the source follower gain, $G_{FD}$ is the conversion gain of the floating diffusion node, and $N_{RX}$ is the reset noise expressed in RMS electrons.

In a CMOS photodiode sensor, $G_{FD}$ and $N_{dark}$ are typically small resulting in a large dynamic range. As the pixel dimensions are scaled down, $V_{dd}$ is typically reduced, which may lead to a reduction of the dynamic range. Accordingly, techniques are needed to improve the dynamic range in image sensors, and, specifically, circuit level techniques are needed to improve gain in the signal path to achieve a high dynamic range as pixel dimensions are reduced.

BRIEF SUMMARY OF THE INVENTION

Embodiments of the invention provide a pixel cell and a method for forming the same. A pixel cell comprises at least one transistor structure. The transistor structure comprises at least one semiconductor channel region, at least one gate for controlling the channel region, and first and second leads respectively coupled to a source region on one side of the at least one channel region and a drain region on an opposite side of the at least one channel region. The transistor structure has at least two threshold voltages associated with the at least one channel region, and an I-V characteristic of the transistor structure is determined at least in part by the threshold voltages. The image sensor has an improved dynamic range as a result of the transistor structure.

DETAILED DESCRIPTION OF THE INVENTION

Figure 1:
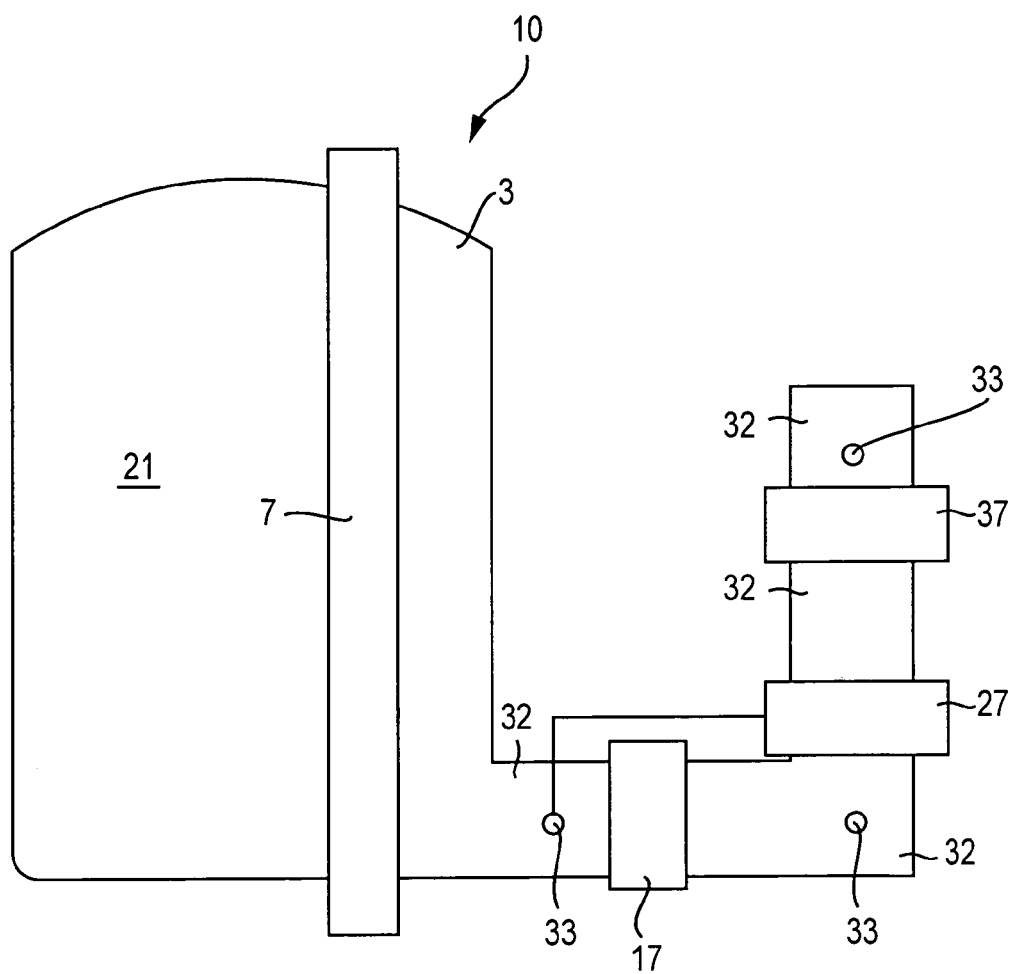
FIG. 1 is a top plan view of an exemplary CMOS pixel cell.

In the following detailed description, reference is made to the accompanying drawings, which form a part hereof and illustrate specific embodiments in which the invention may be practiced. In the drawings, like reference numerals describe substantially similar components throughout the several views. These embodiments are described in sufficient detail to enable those skilled in the art to practice the invention, and it is to be understood that other embodiments may be utilized, and that structural, logical and electrical changes may be made without departing from the spirit and scope of the present invention.

The terms "wafer" and "substrate" are to be understood as including silicon, silicon-on-insulator (SOI), or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in the base semiconductor structure or foundation. In addition, the semiconductor need not be silicon-based, but could be based on silicon-germanium, germanium, or gallium-arsenide.

The term "pixel" refers to a picture element unit cell containing a photo-conversion device and transistors for converting electromagnetic radiation to an electrical signal. For purposes of illustration, a representative pixel is illustrated in the figures and description herein, and typically fabrication of all pixels in an image sensor will proceed simultaneously in a similar fashion.

For purposes of this specification, the term "transistor structure" may refer to a single transistor device, to a number of transistor devices together having common source and drain regions; or, more generally, to any structure in which one or more gates control the conductivity of one or more semiconductor channels that are connected between the structure's input and output leads. Also for purposes of this specification, a sub-threshold region of a transistor structure is a region below a highest threshold voltage, which is referred to herein as a "main threshold voltage," $V_{tM}$. Accordingly, the component device of a transistor structure corresponding to a main threshold voltage is referred to herein as a "main device." All other component devices are referred to herein as "affiliate devices" having corresponding "affiliate threshold voltages."

Figure 3:
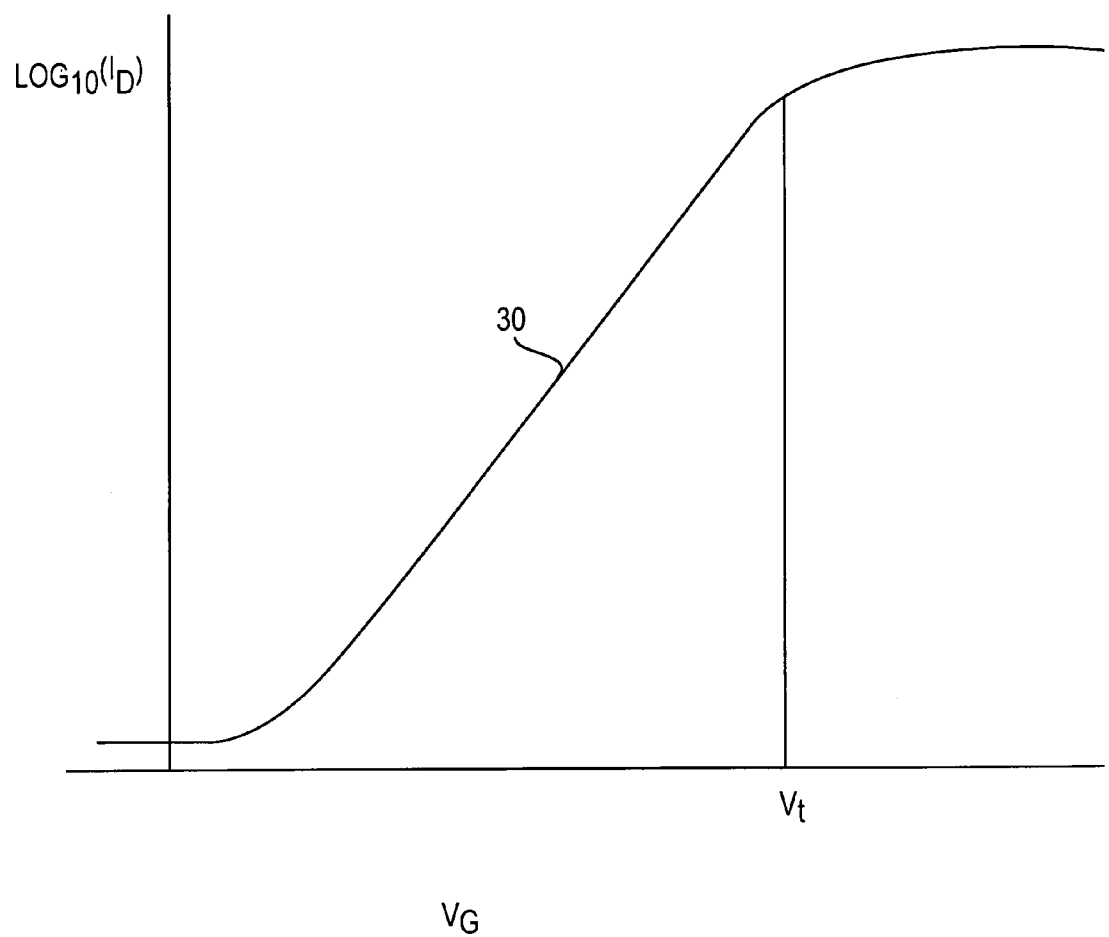
FIG. 3 is a plot illustrating the sub-threshold I-V characteristic of a MOS transistor.

Typically, for a conventional transistor device operating above a threshold voltage, $V_t$, there is a linear region of operation wherein there is a linear dependence of the drain current on the applied bias. However, below a threshold voltage, $V_t$, there is an exponential dependence of the drain current ($I_D$) on the applied bias ($V_G$). FIG. 3 illustrates the sub-threshold current-voltage (I-V) characteristic of a conventional MOS transistor, represented by line 30. On a semi-logarithmic plot of $V_G$ versus $\log_{10}(I_D)$, as shown in FIG. 3, the relationship appears as a straight line 30 and the sub-threshold swing is approximately 75 mV/decade. This type of I-V characteristic is referred to herein as "conventional."

The use of a conventional transistor having a conventional I-V characteristic operating in the sub-threshold region to improve dynamic range in an image sensor is described by Chamberlain et al., "A Novel Wide Dynamic Range Silicon Photodetector and Linear Imaging Array," IEEE Journal of Solid State Circuits, Vol. SC-19(1), pp. 41–48 (1984), which is incorporated herein by reference. Also, U.S. patent application Ser. Nos. 09/903,521 and 09/922,763 describe the use of a conventional transistor operating in both the sub-threshold and linear regions to improve dynamic range in image sensors and are incorporated herein by reference.

Figure 4:
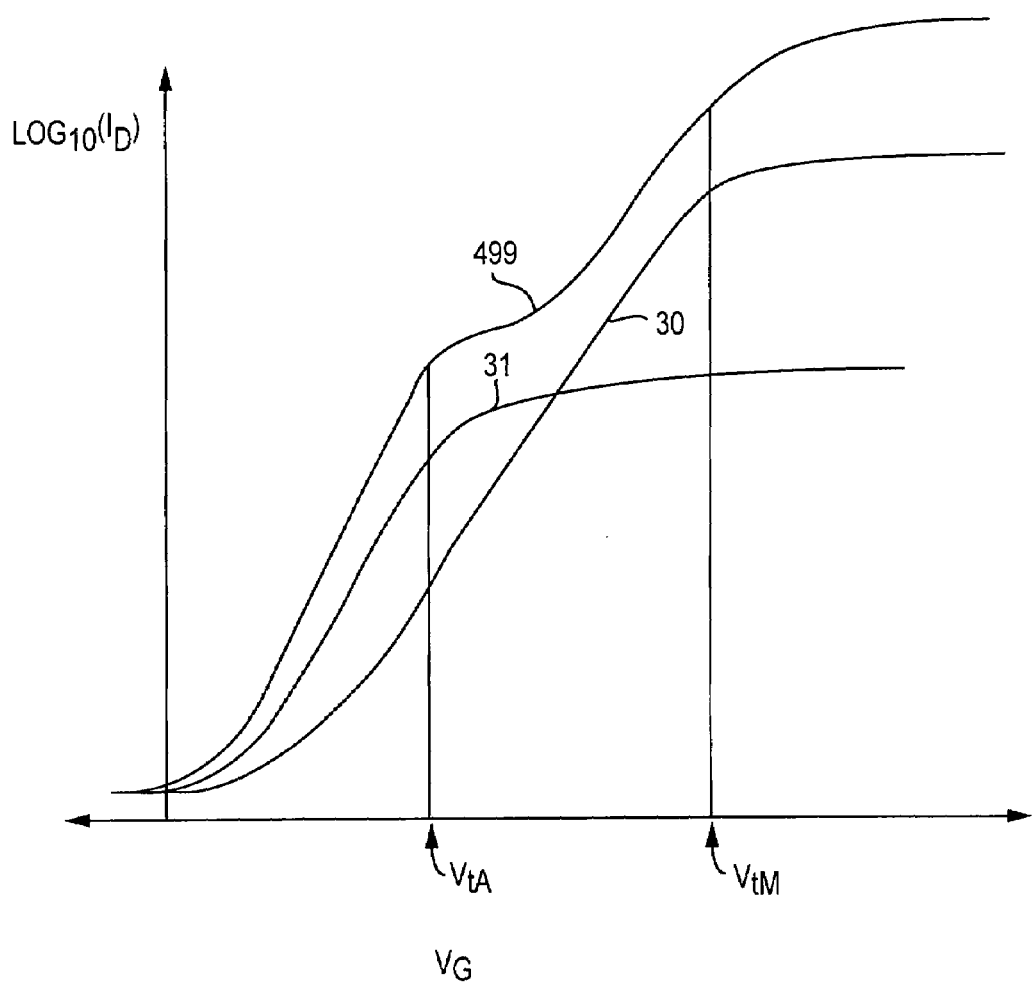
FIG. 4 is a plot illustrating the sub-threshold I-V characteristic of a MOS transistor structure resulting from component I-V characteristics.

According to embodiments of the invention, the sub-threshold characteristic 499 (FIG. 4) of a transistor structure is tailored such that the exponential dependence of the drain current ($I_D$) on the applied bias ($V_G$) does not appear as a straight line in a semi-logarithmic plot, and is therefore referred to herein as "non-conventional." Instead, the sub-threshold characteristic 499 of a transistor structure is tailored to have, for example, a double hump or multiple hump characteristic below a main threshold voltage, $V_{tM}$, as shown in FIG. 4. The double hump characteristic is only exemplary and the relationship may be tailored as desired and described herein to achieve any non-conventional characteristic.

For comparison, the sub-threshold characteristics 30 and 31 of conventional transistors having threshold voltages $V_{tM}$ and $V_{tA}$, respectively, are also shown in FIG. 4.

This non-conventional sub-threshold characteristic 499 may be achieved by providing a transistor structure with at least two threshold voltages. Such a transistor structure comprises a main device having a threshold voltage $V_{tM}$, and at least one affiliate device having a lower threshold voltage $V_{tA}$. By setting the threshold voltages $V_{tM}$ and $V_{tA}$ of the main and affiliate devices, respectively, the sub-threshold I-V characteristic of the transistor structure is tailored.

Ways to obtain a non-conventional sub-threshold characteristic for a transistor structure according to specific embodiments of the invention are described below in connection with FIGS. 5A through 6B.

Figure 5A:
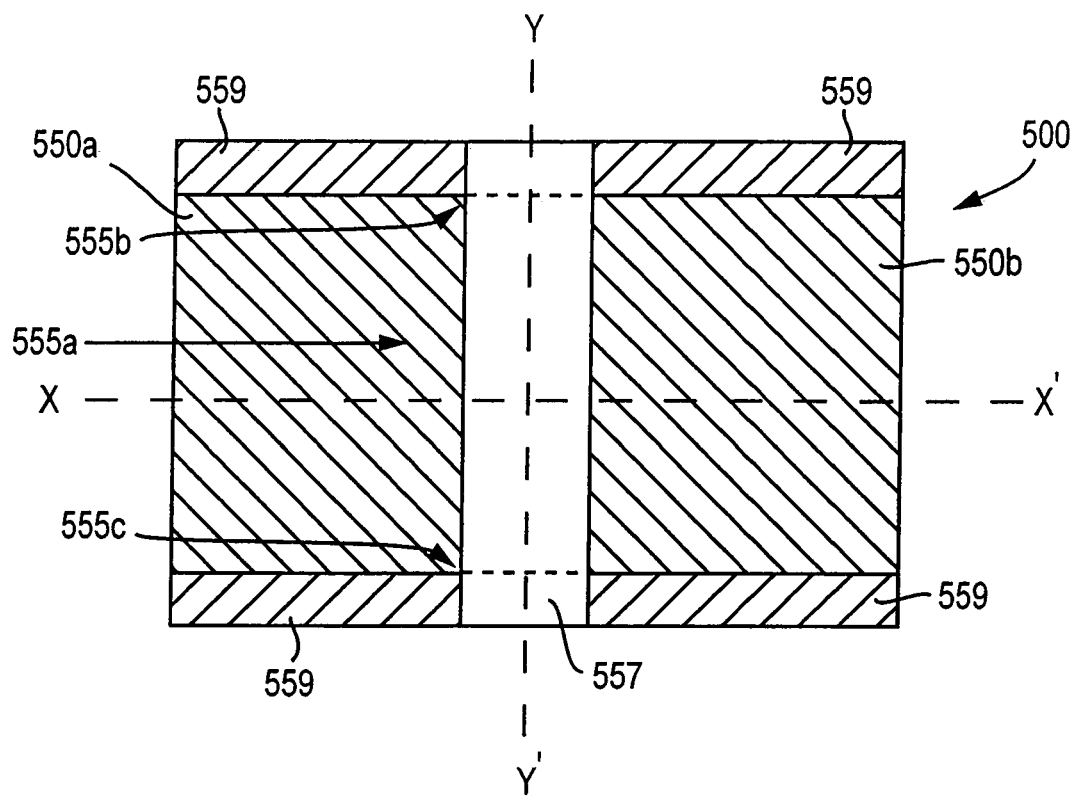
FIG. 5A is a top plan view of a transistor structure according to a first exemplary embodiment of the invention.

Referring to the drawings, FIG. 5A shows a top plan view of a transistor structure 500 according to a first exemplary embodiment of the invention. There are isolation regions, depicted as shallow trench isolation regions 559, which define between them an active area. The active area comprises a channel region 558 (FIG. 5C), a source region 550a, and a drain region 550b. Overlying the channel region 558 and a portion of the isolation regions 559 is a gate structure 557.

The transistor structure 500 has a main device 555a and affiliate devices 555b, 555c. The main device 555a is a normal conduction path of a transistor as is known in the art. Each of the affiliate devices 555b and 555c are parasitic devices and provide parasitic conduction paths along edges of the source region 550a to the drain region 550b. Such parasitic devices are known in the art, but are typically considered undesirable and are eliminated. In this embodiment, however, the parasitic devices 555b and 555c are optimized and utilized to tailor the sub-threshold I-V characteristic of the transistor structure 500.

The parasitic devices 555b and 555c, and the main device 555a are used to tailor the sub-threshold I-V characteristic of the transistor structure 500 by adjusting the threshold voltages of the parasitic devices 555b and 555c and the main device 555a. The main device 555a has a higher threshold voltage, $V_{tM}$, than the threshold voltages of the parasitic devices 555b and 555c, $V_{tA}$. The parasitic devices 555b and 555c may have a same threshold voltage, $V_{tA}$, or different threshold voltages, $V_{tA555b}$ and $V_{tA555c}$.

Figure 5B:
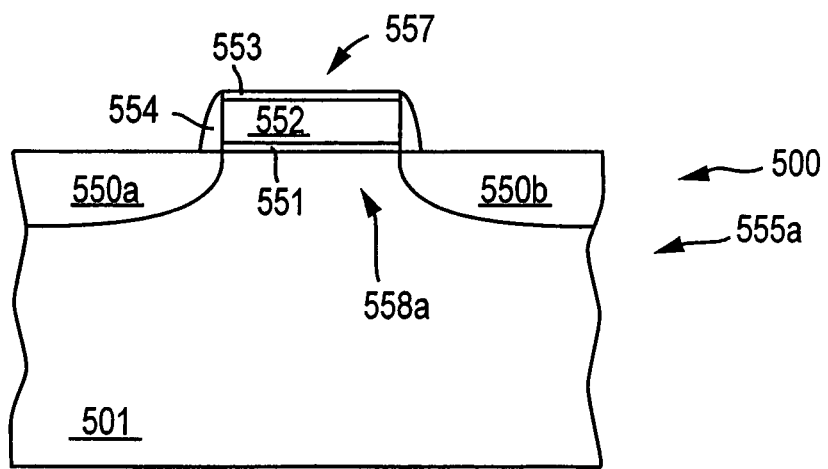
FIG. 5B is a cross sectional view of the transistor structure of FIG. 5A along line XX'.

The fabrication of the transistor structure 500 is described in connection with FIGS. 5B and 5C, and may be carried out by methods known in the art. FIG. 5B shows a cross sectional view of the transistor structure 500 along line XX'. Specifically, FIG. 5B depicts a section of the transistor structure 500 corresponding to the main device 555a. The main device 555a and the parasitic devices 555b and 555c are formed at the same time as a single structure 500 by the same general steps described below in connection with FIG. 5B. Differences between the devices 555a, 555b, and 555c are explained below in connection with FIG. 5C.

As shown in FIG. 5B, a gate structure 557 of the transistor structure 500 is formed over the substrate 501. Illustratively, the gate structure 557 is a multilayer gate stack 557 comprising a first insulating layer 551 of grown or deposited silicon oxide on the substrate 501, which is a gate oxide layer; a gate electrode 552, which is preferably a layer of polysilicon; and a second insulating layer 553, which may be formed of an oxide ($SiO_2$), a nitride (silicon nitride), an oxynitride (silicon oxynitride), ON (oxide-nitride), NO (nitride-oxide), or ONO (oxide-nitride-oxide). The first and second insulating layers, 551 and 553, and the polysilicon layer 552 may be formed by conventional deposition methods, such as chemical vapor deposition (CVD) or plasma chemical vapor deposition (PECVD), among others. The layers 551, 552, and 553 are patterned to form the multilayer stack structure shown in FIG. 5B.

Subsequently, source and drain regions 550a and 550b may be formed by known methods adjacent to the gate structure 557. The source and drain regions 550a and 550b define between them a channel region 558, which, for the example of FIG. 5B, corresponds to the normal conduction path of the main device 555a. To complete the structure shown in FIG. 5B, sidewall spacers 554 are then formed on the sidewalls of the gate structure 557 by known methods. The sidewall spacers 554 may be an appropriate dielectric material, such as silicon dioxide, silicon nitride, an oxynitride, ON, NO, ONO, or TEOS, among others.

The invention is not limited to the gate structure 557 described above. For example, additional layers may be added to the gate structure 557 or the gate structure 557 may be altered as is desired and known in the art. Such additional layers may include a silicide layer (not shown) formed between the polysilicon layer 552 and the second insulating layer 553. The silicide layer may be titanium silicide, tungsten silicide, cobalt silicide, molybdenum silicide, or tantalum silicide. An additional conductive layer may also be a barrier layer/refractor metal, such as TiN/W or $W/N_x/W$, or it could be formed entirely of $WN_x$.

Figure 5C:
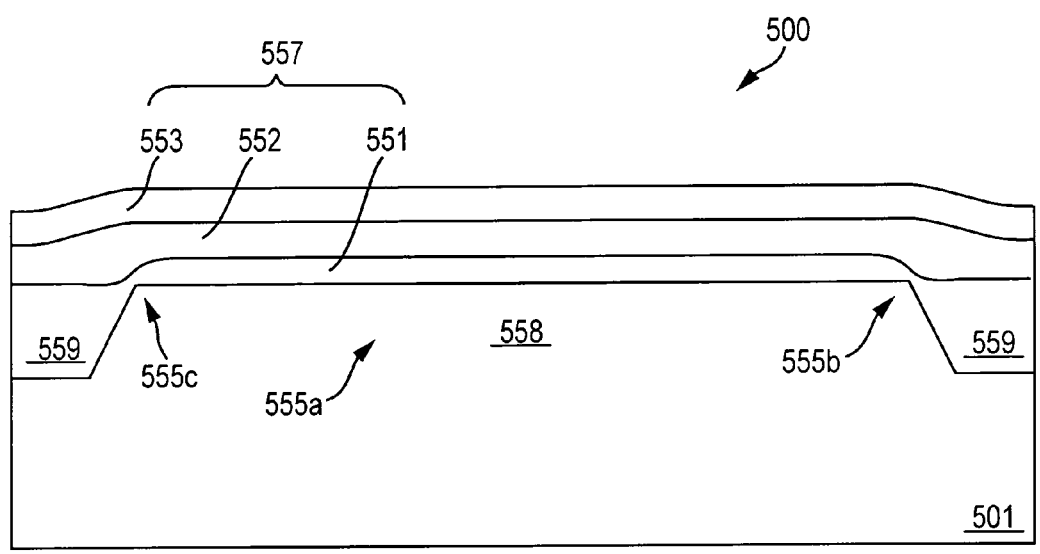
FIG. 5C is a cross sectional view of a portion of the transistor structure of FIG. 5A along line YY'.

FIG. 5C shows a cross sectional view of the transistor structure 500 along line YY'. There are isolation regions 559 formed within the substrate 501 of a dielectric material, which may include an oxide, such as SiO or $SiO_2$; oxynitride; a nitride, such as silicon nitride; silicon carbide; a high temperature polymer; or other suitable material. As noted above, in this example, the isolation regions 559 are shallow trench isolation (STI) regions, formed by known STI processes. STI regions 559 may be formed prior to the formation of the transistor structure 500.

As described above in connection with FIG. 5B, the transistor structure 500 comprises the gate oxide layer 551 over the substrate 501. The oxide layer 551 is between the STI regions 559. Over the oxide layer 551 and isolation regions 559 is the polysilicon layer 552, and over the polysilicon layer 552 is the second insulating layer 553. The main device 555a is between the parasitic devices 555b and 555c. The parasitic devices 555b and 555c are each adjacent to an STI region 559 on opposing sides of the main device 555a. The portion of the active area underlying the gate 557 is the channel region 558.

The threshold voltages for the main device 555a and parasitic devices 555b and 555c of the transistor structure 500 are set to tailor the sub-threshold I-V characteristic of the transistor structure 500. The threshold voltage, $V_{tM}$, of the main device 555a is higher than the threshold voltages, $V_{tA555b}$, $V_{tA555c}$, of the parasitic devices 555b and 555c, respectively.

The threshold voltages for each device may be set by techniques known in the art. For example, aspects of the main device 555a and parasitic devices 555b and 555c, such as the gate oxide 551 thickness and channel dopant concentration of portions of the channel region 558 corresponding to each of the devices 558a, 558b, and 558c, may be altered so that the main device has a different threshold voltage than the parasitic devices. Illustratively, to set the threshold voltage of the main device 555a higher than the threshold voltage of the parasitic device 555b the gate oxide layer 551 over the normal conduction path of the main device 555a may be formed thicker than the gate oxide layer 551 over the parasitic conduction path of the parasitic device 555b, as shown in FIG. 5C. Also, the dopant concentration in a portion of the channel region 558 corresponding to the main device 555a may be higher than in a portion of the channel region 558 corresponding to the parasitic device 555b.

Similarly, to set the threshold voltages of the parasitic devices 555b and 555c to different values, aspects, such as gate oxide thickness and channel dopant concentration for the parasitic devices 555b and 555c may be different with respect to one another. The above techniques may be used together or only one technique may be used to achieve the desired threshold voltages for the main device 555a and parasitic devices 555b and 555c.

Figure 6A:
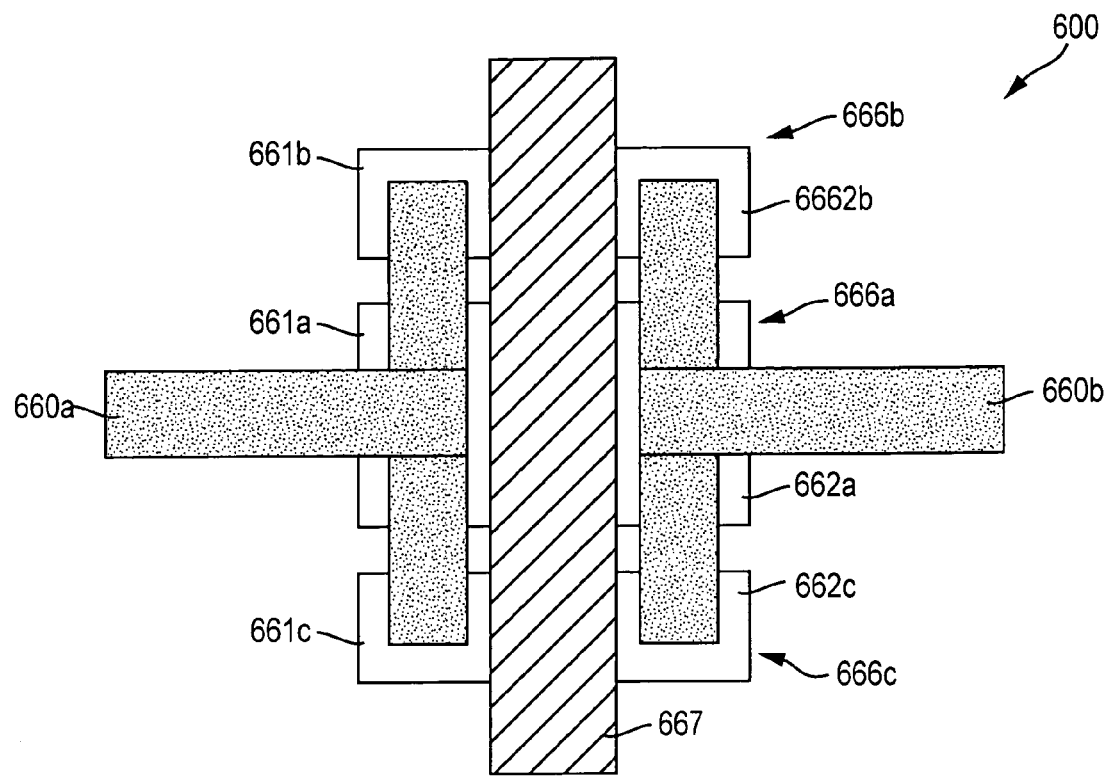
FIG. 6A is a top plan view of a transistor structure according to a second exemplary embodiment of the invention.
Figure 6B:
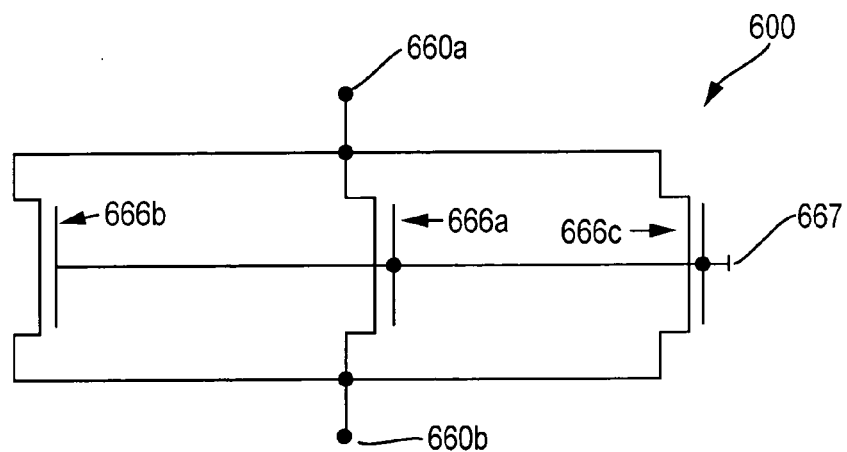
FIG. 6B is a circuit diagram representing the transistor structure of FIG. 6A.

FIGS. 6A and 6B illustrate a transistor structure 600 according to a second exemplary embodiment of the invention. FIG. 6A is a top plan view of the transistor structure 600, and FIG. 6B is an equivalent electrical diagram of the transistor structure 600. The transistor structure 600 comprises at least two transistors or gate-controlled semiconductor channels connected in parallel. One or more of the transistors that comprise transistor structure 600, may be a transistor structure 500 as described above in connection with FIGS. 5A through 5C.

For exemplary purposes, transistor structure 600 is shown comprising three conventional transistors with channels connected in parallel and with a shared gate 667; but the invention is not limited to a specific number. As shown in FIGS. 6A and 6B, there is a main device 666a and two affiliate devices 666b and 666c. For exemplary purposes the main device 666a is shown between the affiliate devices 666b and 666c. The invention, however, is not limited to such a specific configuration, and any configuration having a main device 666a connected in parallel with at least one affiliate device 666b, 666c is possible.

Each of the devices 666a, 666b, and 666c have corresponding source regions 661a, 661b, and 661c, and drain regions 662a, 662b, and 662c, respectively. The individual source regions 661a, 661b, and 661c are connected, such that the transistor structure 600 has a common source 660a. Likewise, the individual drain regions 662a, 662b, and 662c are connected, such that transistor structure 600 has a common drain 660b.

Each of the devices 666a, 666b, and 666c may be generally formed as described above in connection with FIG. 5B, and techniques to set the threshold voltages of the devices 666a, 666b, and 666c are described below. Subsequent to the formation of the individual devices 666a, 666b, 666c, known methods may be used to form the common source 660a by connecting the individual source regions 661a, 661b, and 661c; and the common drain 660b by connecting the individual drain regions 662a, 662b, and 662c.

The threshold voltage for the main device 666a and affiliate devices 666b and 666c of the transistor structure 600 may be set by altering the threshold voltages for the devices according to techniques known in the art. Aspects, such as the gate oxide thickness, threshold voltage adjust implant level, and gate work-function, may be altered in one or more of the main device 666a and affiliate devices 666b and 666c, such that each of the devices 666a, 666b, and 666c has a desired threshold voltage. For example, to set the threshold voltage of the main device 666a higher than the threshold voltage(s) of the affiliate devices 666b and 666c, any of the gate oxide thickness, threshold voltage adjust implant level, and gate work-function may be higher for the main device 666a than the affiliate devices 666b and 666c.

A desired threshold voltage for each device 666a, 666b, and 666c may be achieved by altering any individual aspect or any combination of aspects. A desired threshold voltage for each device 666a, 666b, and 666c may be achieved by altering the same or different aspect(s) in each device. The threshold voltages of the affiliate devices 666b and 666c may be a same threshold voltage, $V_{tA}$, or may be different threshold voltages, $V_{tA666a}$ and $V_{tA666b}$.

According to an embodiment of the invention, at least one transistor structure having a non-conventional sub-threshold I-V characteristic and functioning as an active element in an image sensor is used to improve the dynamic range of an image sensor.

Figure 7:
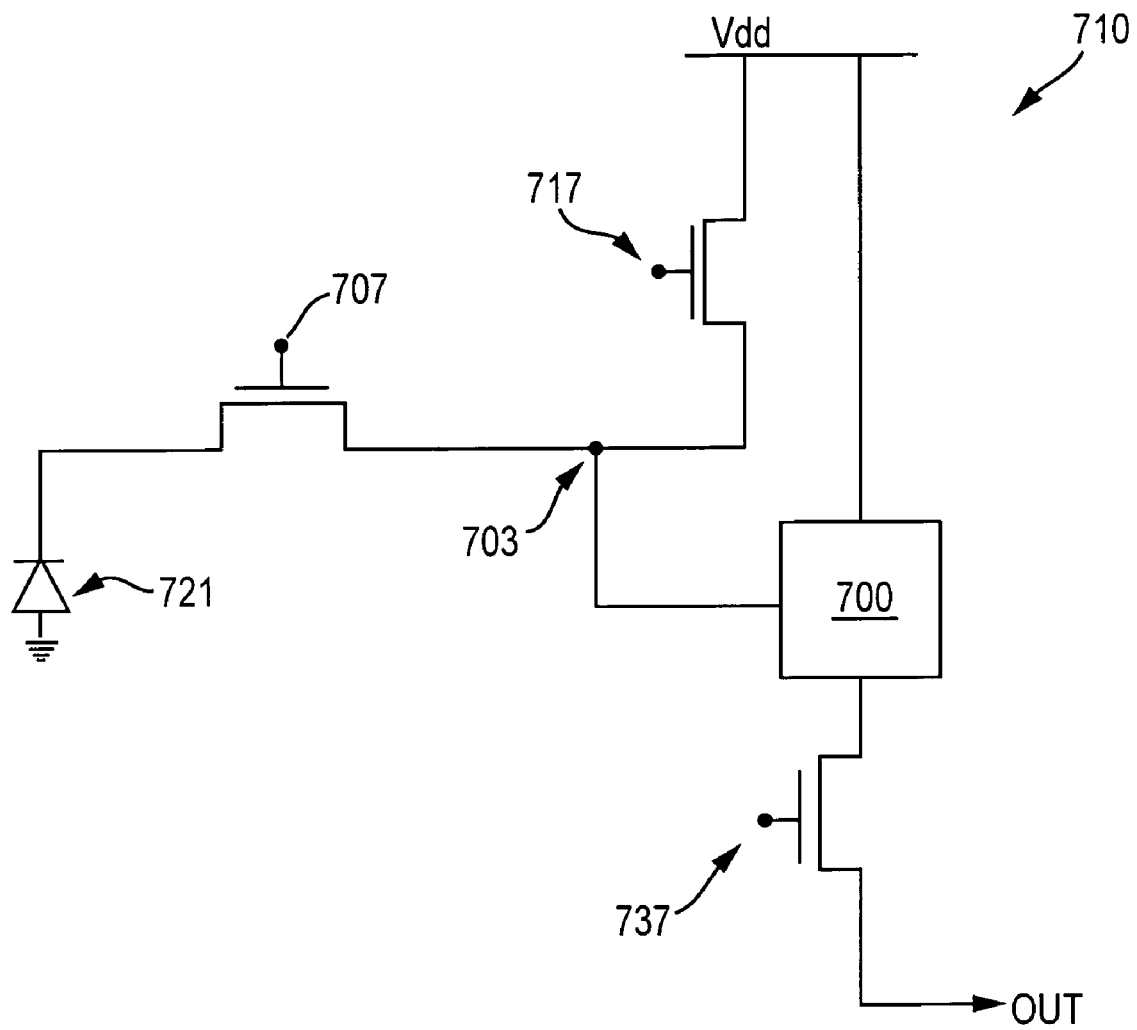
FIG. 7 illustrates a CMOS pixel cell according to a third exemplary embodiment of the invention.

FIG. 7 illustrates a pixel cell 710, which has at least one transistor structure 700 having a non-conventional sub-threshold I-V characteristic which is tailored as described above in connection with FIGS. 5A through 6B. Transistor structure 700 is illustratively a source follower transistor structure 700, but the transistor structure 700 may be any active element of a pixel cell which operates at least in part in a sub-threshold region. By tailoring the sub-threshold I-V characteristic of the transistor structure 700 the dynamic range for the pixel cell 710 is modulated.

An exemplary configuration of CMOS pixel cell 710 is described below. It should be noted that the configuration is only exemplary and that various changes may be made as are known in the art, and the pixel cell 710 may have other configurations.

The pixel cell 710 comprises a photo-conversion device, which is illustratively a photodiode 721, for collecting charges generated by light incident on the pixel. Connected to the photodiode 721 is a transfer gate 707 for transferring photoelectric charges from the photodiode 721 to a sensing node, which is illustratively a floating diffusion region 703. The floating diffusion region 703 is electrically connected to the gate of an output source follower transistor structure 700, which receives an electrical signal from the floating diffusion region 703. The source follower transistor structure may be any one of the transistor structures 500 (FIG. 5A) or 600 (FIG. 6A and 6B). The pixel cell 710 also includes a reset transistor having a gate 717 for resetting the floating diffusion region 703 to a predetermined voltage before sensing a signal; and a row select transistor 737 for outputting a signal from the source follower transistor structure 700 to an output terminal in response to an address signal.

Figure 2:
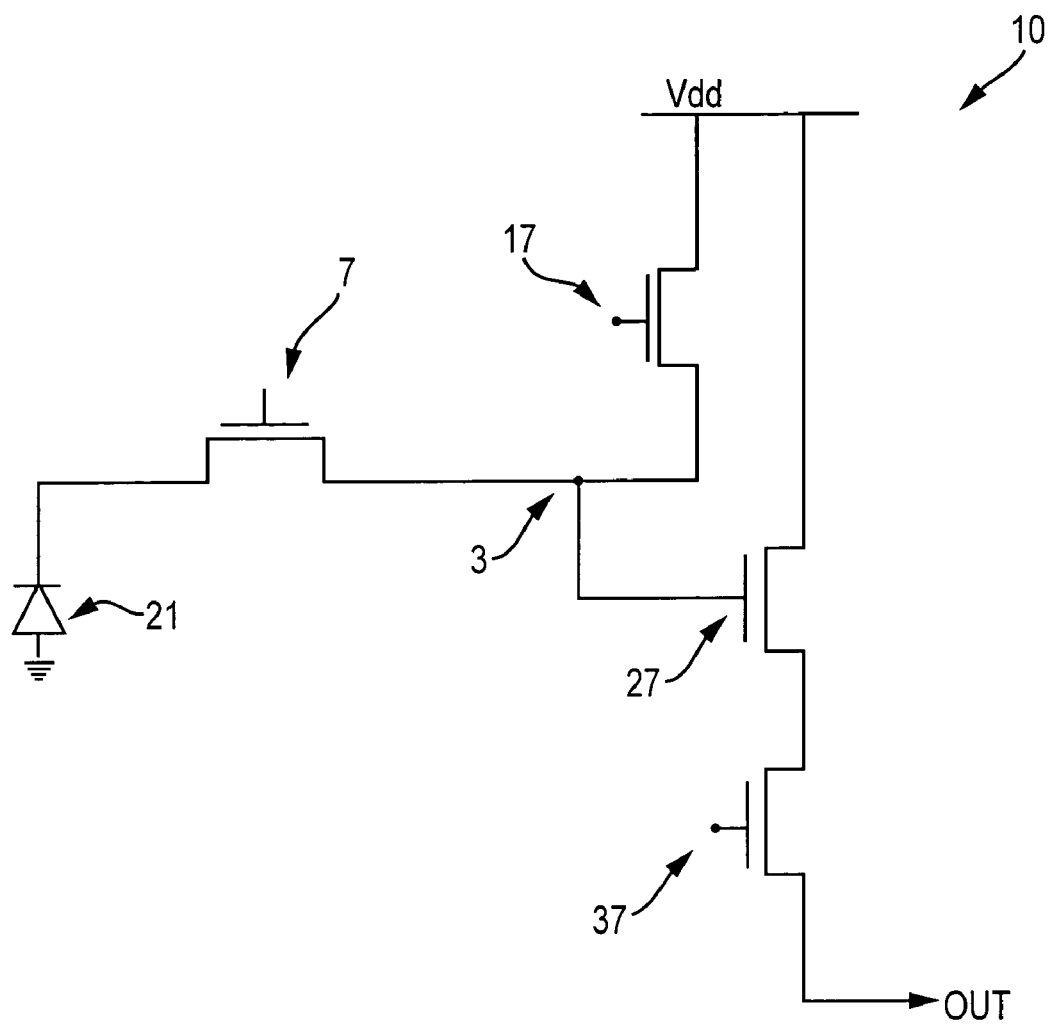
FIG. 2 is a circuit diagram of the CMOS pixel cell of FIG. 1.

In a conventional pixel cell 10 (FIGS. 1 and 2), dark areas of an imaged scene operate the gate 27 of the source follower transistor in the sub-threshold region, while bright areas of an imaged scene operate the gate 27 of the source follower transistor in the linear region. As a result, a signal corresponding to the darker areas is amplified by a different amount than a signal corresponding to the bright areas. By tailoring the sub-threshold I-V characteristic of the source follower transistor structure 700 in pixel cell 710, the gain of the source follower transistor structure 700 is improved and the sub-threshold and linear regions of the source follower transistor structure may have a same or similar amplification factor for a signal at the gate of a source follower transistor structure, resulting in improved dynamic range.

Although the invention is described in connection with a four-transistor (4T) pixel cell, the invention may also be implemented in other CMOS pixel cell designs or other circuits. Without being limiting, such a design may include a three-transistor (3T) cell, a five-transistor (5T) cell, or a six-transistor (6T) cell. A 3T cell has one fewer transistor, for example, a 3T cell may lack a transfer transistor. A 5T cell differs from the 4T cell by the addition of a transistor, such as a shutter transistor or a CMOS photogate transistor; and a 6T cell further includes an additional transistor, such as an anti-blooming transistor.

Figure 8:
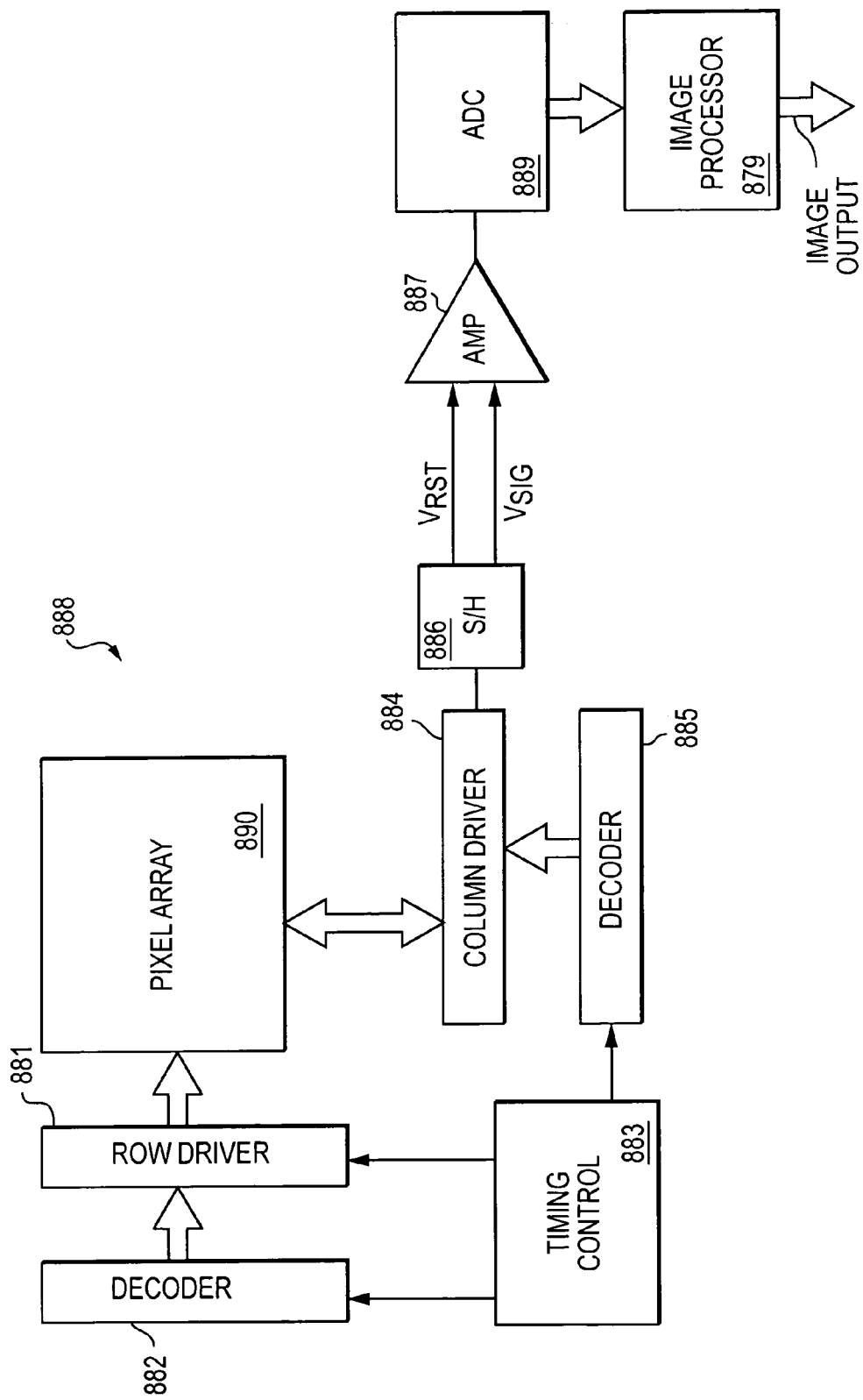
FIG. 8 is a simplified block diagram of a CMOS image sensor incorporating the pixel cell of FIG. 7.

FIG. 8 is a block diagram of an exemplary CMOS image sensor 888 according to an embodiment of the invention. The imaging device has a pixel array 890 containing a plurality of pixel cells arranged in rows and columns. One or more of the pixel cells in the array 890 is a pixel cell 710 as described above in connection with FIG. 7.

The image sensor 888 operates as is known in the art. Accordingly, the pixels of each row in array 890 are all turned on at the same time by a row select line, and the pixels of each column are selectively output by respective column select lines. The row lines are selectively activated by a row driver 881 in response to row address decoder 882. The column select lines are selectively activated by a column driver 884 in response to column address decoder 885. The pixel array is operated by the timing and control circuit 883, which controls address decoders 882 and 885 for selecting the appropriate row and column lines for pixel signal readout. The pixel column signals, which typically include a pixel reset signal ($V_{rst}$) and a pixel image signal ($V_{sig}$); are read by a sample and hold circuit (S/H) 886 associated with the column selector 865. A differential signal ($V_{rst}-V_{sig}$) is produced by differential amplifier (AMP) 887 for each pixel which is amplified and digitized by analog to digital converter (ADC) 889. The analog to digital converter 889 supplies the digitized pixel signals to an image processor 879 which forms a digital image.

Although the invention is described in connection with a CMOS image sensor, the invention is also applicable to analogous structures of a charge coupled device (CCD) image sensor.

Figure 9:
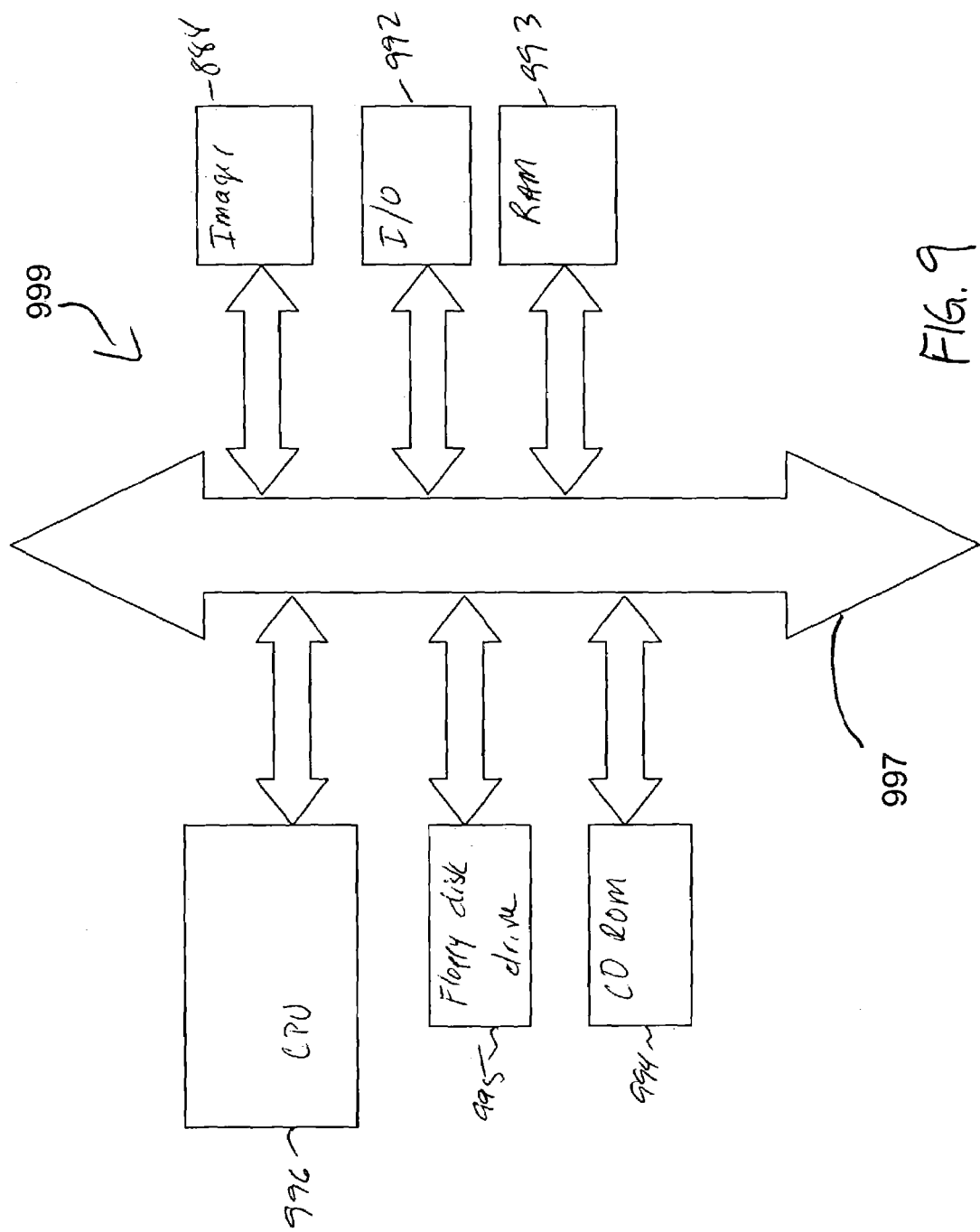
FIG. 9 illustrates a simplified block diagram of a computer processor system incorporating the FIG. 8 CMOS image sensor.

A typical processor-based system 999 including an image sensor 888 as described above in connection with FIG. 8 is illustrated generally in FIG. 9. A processor-based system 999 is exemplary of a system having digital circuits that could include image sensors. Without being limiting, such a system could include a computer system, camera system, scanner, machine vision, vehicle navigation, video phone, surveillance system, auto focus system, star tracker system, motion detection system, image stabilization system, and data compression system.

A processor-based system, for example a computer system, generally comprises a central processing unit (CPU) 996, such as a microprocessor, that communicates with an input/output (I/O) device 992 over a bus 997. The image sensor 888, which produces an image output from a pixel array, also communicates with the system 999 over bus 997. The processor-based system 999 also includes random access memory (RAM) 993, and may include peripheral devices, such as a floppy disk drive 995 and a compact disk (CD) ROM drive 994, which also communicate with CPU 996 over the bus 997. The image sensor 888 may be combined with a processor, such as a CPU, digital signal processor, or microprocessor, with or without memory storage on a single integrated circuit or on a different chip than the processor.

The invention is well suited for use in imaging devices, as is described above. The invention, however has broader applicability and is not limited to imaging devices. It may be used in any other type of MOS transistor circuit.

It is again noted that the above description and drawings are exemplary and illustrate preferred embodiments that achieve the objects, features and advantages of the present invention. It is not intended that the present invention be limited to the illustrated embodiments. Any modification of the present invention which comes within the spirit and scope of the following claims should be considered part of the present invention.

What is claimed as new and desired to be protected by Letters Patent of the United States is:

1. A pixel cell comprising:
   a photo-conversion device for producing photogenerated charges; and
   a circuit for producing an output signal from said photogenerated charges, said circuit comprising at least a single transistor structure, the at least single transistor structure comprising:
   at least one semiconductor channel region;
   at least one gate for controlling the channel region; and
   first and second leads respectively coupled to a source region on one side of the at least one channel region and a drain region on an opposite side of the at least one channel region, wherein the at least single transistor structure is configured to have at least two threshold voltages associated with the at least one channel region at a same time, and wherein a current-voltage characteristic of the single transistor structure is determined at least in part by the threshold voltages.

2. The pixel cell of claim 1, wherein the at least single transistor structure is an active element for operating at least in part in a sub-threshold region.

3. The pixel cell of claim 1, wherein the at least single transistor structure is a source follower transistor structure.

4. The pixel cell of claim 1, wherein the at least single transistor structure comprises first, second, and third channel regions connected in parallel.

5. The pixel cell of claim 4, wherein the first channel region corresponds to a first threshold voltage and the second and third channel regions correspond to second and third threshold voltages, respectively, and wherein the first threshold voltage is higher than the second and third threshold voltages.

6. The pixel cell of claim 4, wherein a first channel region corresponds to a first threshold voltage and second and third channel regions correspond to a second threshold voltage, and wherein the first threshold voltage is higher than the second threshold voltage.

7. The pixel cell of claim 1, wherein the at least single transistor structure comprises one channel region, and wherein the channel region comprises a normal conduction path and at least one parasitic conduction path.

8. The pixel cell of claim 7, wherein the normal conduction path is associated with a highest first threshold voltage and the at least one parasitic conduction path is associated with at least a second lower threshold voltage.

9. The pixel cell of claim 8, wherein the single transistor structure comprises first and second parasitic conduction paths, and wherein the first and second parasitic conduction paths are associated with a second threshold voltage.

10. The pixel cell of claim 8, wherein the single transistor structure comprises first and second parasitic conduction paths, and wherein the first and second parasitic conduction paths are associated with second and third threshold voltages, respectively.

11. The pixel cell of claim 1, wherein the two or more threshold voltages result at least in part from the at least single transistor structure having any of: two or more gate oxide thicknesses, two or more channel dopant concentrations, and two or more gate work-functions.

12. The pixel cell of claim 1, wherein the current-voltage characteristic is such that a sub-threshold region and a linear region provide a same or similar amplification factor for a signal.

13. The pixel cell of claim 1, wherein the photo-conversion device is a pinned photodiode.

14. The pixel cell of claim 1, wherein the at least single transistor structure is a reset transistor.

15. The pixel cell of claim 1, wherein the at least single transistor structure is a source follower transistor.

16. The pixel cell of claim 1, wherein the at least single transistor structure is a transfer transistor.

17. A pixel cell comprising:
a photo-conversion device for producing photogenerated charges; and
a circuit for producing an output signal from said photo-generated charges, said circuit comprising at least a single transistor structure, the at least single transistor structure comprising:
a channel region;
a gate for controlling the channel region; and
first and second leads respectively coupled to a source region on one side of the channel region and a drain region on an opposite side of the channel region, wherein the channel region comprises a normal conduction path and at least one parasitic conduction path, and wherein the normal conduction path is associated with a highest first threshold voltage, and wherein the at least one parasitic conduction path is associated with at least a second threshold voltage, and wherein a current-voltage characteristic of the single transistor structure is determined at least in part by the threshold voltages.

18. The pixel cell of claim 17, wherein the at least single transistor structure is an active element for operating at least in part in a sub-threshold region.

19. The pixel cell of claim 17, wherein the at least single transistor structure is a source follower transistor structure.

20. The pixel cell of claim 17, wherein the channel region comprises first and second parasitic conduction paths, and wherein the first and second parasitic conduction paths are associated with second and third threshold voltages, respectively.

21. The pixel cell of claim 17, wherein the first and at least second threshold voltages result at least in part from the at least one transistor structure having any of: at least two gate oxide thicknesses and at least two channel dopant concentrations.

22. The pixel cell of claim 17, wherein the at least single transistor structure is a reset transistor.

23. The pixel cell of claim 17, wherein the at least single transistor structure is a source follower transistor.

24. The pixel cell of claim 17, wherein the at least single transistor structure is a transfer transistor.

25. An image sensor, comprising:
an array of pixel cells, wherein at least one of the pixel cells comprises:
a photo-conversion device for producing photogenerated charges; and
a circuit for producing an output signal from said photo-generated charges, said circuit comprising a single transistor structure, the single transistor structure comprising:
at least one semiconductor channel region;
at least one gate for controlling the channel region; and
first and second leads respectively coupled to a source region on one side of the at least one channel region and a drain region on an opposite side of the at least one channel region, wherein the transistor structure is configured to have at least two threshold voltages associated with the at least one channel region at a same time, and wherein a current-voltage characteristic of the transistor structure is determined at least in part by the threshold voltages.

26. The image sensor of claim 25, wherein the single transistor structure is an active element for operating at least in part in a sub-threshold region.

27. The image sensor of claim 25, wherein the single transistor structure is a source follower transistor structure.

28. The image sensor of claim 25, wherein the single transistor structure comprises first, second, and third channel regions connected in parallel.

29. The image sensor of claim 28, wherein the first channel region corresponds to a first threshold voltage and the second and third channel regions correspond to second and third threshold voltages, respectively, and wherein the first threshold voltage is higher than the second and third threshold voltages.

30. The image sensor of claim 28, wherein the first channel region corresponds to a first threshold voltage and the second and third channel regions correspond to a second threshold voltage, and wherein the first threshold voltage is higher than the second threshold voltage.

31. The system of claim 28, wherein the first channel region corresponds to a first threshold voltage and the second and third channel regions correspond to a second threshold voltage, and wherein the first threshold voltage is different than the second threshold voltage.

32. The image sensor of claim 25, wherein the single transistor structure comprises one channel region, and wherein the channel region comprises a normal conduction path and at least one parasitic conduction path.

33. The image sensor of claim 32, wherein the normal conduction path is associated with a highest first threshold voltage and the at least one parasitic conduction path is associated with at least a second threshold voltage.

34. The image sensor of claim 33, wherein the single transistor structure comprises first and second parasitic conduction paths, and wherein the first and second parasitic conduction paths are associated with a second threshold voltage.

35. The image sensor of claim 33, wherein the single transistor structure comprises first and second parasitic conduction paths, and wherein the first and second parasitic conduction paths are associated with second and third threshold voltages, respectively.

36. The image sensor of claim 25, wherein the two or more threshold voltages result at least in part from the transistor structure having one or more of: two or more gate oxide thicknesses, two or more channel dopant concentrations, and two or more gate work-functions.

37. The image sensor of claim 25, wherein the current-voltage characteristic is such that a sub-threshold region and a linear region provide a same or similar amplification factor for a signal.

38. A processor system, comprising:
(i) a processor; and
(ii) an image sensor coupled to the processor, the image sensor comprising:
one or more pixel cells, the one or more pixel cells comprising:
a photo-conversion device for producing photogenerated charges; and a circuit for producing an output signal from said photogenerated charges, said circuit comprising a single transistor structure, the single transistor structure comprising:
at least one semiconductor channel region;
at least one gate for controlling the channel region; and
first and second leads respectively coupled to a source region on one side of the at least one channel region and a drain region on an opposite side of the at least one channel region, wherein the transistor structure is configured to have at least two threshold voltages associated with the at least one channel region at a same time, and wherein a current-voltage characteristic of the transistor structure is determined at least in part by the threshold voltages.

39. The system of claim 38, wherein the single transistor structure is an active element for operating at least in part in a sub-threshold region.

40. The system of claim 38, wherein the single transistor structure comprises first, second, and third channel regions connected in parallel.

41. The system of claim 38, wherein the first channel region corresponds to a first threshold voltage and the second and third channel regions correspond to second and third threshold voltages, respectively, and wherein the first, second and third threshold voltages are different from one another.

* * * * *